United States Patent
Lee et al.

(10) Patent No.: US 11,594,262 B2
(45) Date of Patent: Feb. 28, 2023

(54) SEMICONDUCTOR PACKAGE AND ELECTRONIC DEVICE INCLUDING SAME

(71) Applicant: Samsung Electronics Co., Ltd., Suwon-si (KR)

(72) Inventors: Ji Hwa Lee, Namyangju-si (KR); Kyung Duk Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 27 days.

(21) Appl. No.: 17/238,734

(22) Filed: Apr. 23, 2021

(65) Prior Publication Data

US 2021/0351103 A1    Nov. 11, 2021

(30) Foreign Application Priority Data

May 8, 2020  (KR) .......................... 10-2020-0055194

(51) Int. Cl.
| | | |
|---|---|---|
| G11C 16/04 | (2006.01) | |
| G11C 5/14 | (2006.01) | |
| G11C 7/04 | (2006.01) | |
| H01L 23/38 | (2006.01) | |
| H01L 25/065 | (2023.01) | |

(52) U.S. Cl.
CPC .............. *G11C 5/147* (2013.01); *G11C 7/04* (2013.01); *H01L 23/38* (2013.01); *H01L 25/0652* (2013.01); *H01L 25/0657* (2013.01); *H01L 2225/0651* (2013.01); *H01L 2225/06506* (2013.01); *H01L 2225/06562* (2013.01); *H01L 2225/06589* (2013.01)

(58) Field of Classification Search
CPC ................................. G11C 5/147; G11C 7/04
See application file for complete search history.

(56) References Cited

U.S. PATENT DOCUMENTS

| | | |
|---|---|---|
| 5,569,950 A | 10/1996 | Lewis et al. |
| 7,544,883 B2 | 6/2009 | Chen et al. |
| 9,183,000 B2 | 11/2015 | Ichida et al. |
| 9,228,763 B2 | 1/2016 | Kim et al. |

(Continued)

FOREIGN PATENT DOCUMENTS

| | | |
|---|---|---|
| EP | 3096366 A2 | 11/2016 |
| JP | 4796868 B2 | 10/2011 |
| KR | 20110066577 A | 6/2011 |

OTHER PUBLICATIONS

European Search Report dated Sep. 2, 2021, corresponding to EP Patent Application No. 21 158 989.0.

*Primary Examiner* — Pho M Luu
(74) *Attorney, Agent, or Firm* — Harness, Dickey & Pierce, P.L.C.

(57) ABSTRACT

Provided is a semiconductor package. The semiconductor package comprises a semiconductor chip on a substrate, a voltage measurement circuit configured to measure an external voltage to be input into the semiconductor chip and a thermoelectric module configured to convert heat released from the semiconductor chip into an auxiliary power, and configured to apply the auxiliary power to the semiconductor chip, the thermoelectric module being separated from the voltage measurement circuit, wherein the voltage measurement circuit is configured to control the thermoelectric module to apply the auxiliary power to the semiconductor chip in response to a change in the external voltage.

20 Claims, 17 Drawing Sheets

(56) References Cited

U.S. PATENT DOCUMENTS

| | | |
|---|---|---|
| 9,448,121 B2 * | 9/2016 | Chien .................... F25B 21/04 |
| 9,837,595 B2 | 12/2017 | Yu et al. |
| 10,083,891 B1 * | 9/2018 | Graf ....................... H01L 25/16 |
| 2006/0001140 A1 | 1/2006 | Lee et al. |
| 2011/0032679 A1 | 2/2011 | Baek et al. |
| 2015/0062824 A1 | 3/2015 | Hyun et al. |
| 2015/0089961 A1 | 4/2015 | Duzly et al. |
| 2016/0062435 A1 | 3/2016 | Arakawa et al. |
| 2016/0093553 A1 | 3/2016 | Prakash et al. |
| 2017/0038805 A1 * | 2/2017 | Chun ..................... G11C 7/04 |
| 2018/0358080 A1 | 12/2018 | Huang |
| 2020/0144237 A1 | 5/2020 | Kang et al. |

* cited by examiner

SEMICONDUCTOR PACKAGE AND ELECTRONIC DEVICE INCLUDING SAME

CROSS-REFERENCE TO RELATED APPLICATION

This application claims priority from Korean Patent Application No. 10-2020-0055194 filed on May 8, 2020 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor package and an electronic device including the same.

2. Description of the Related Art

Recently, when performing operations such as data read and write on a storage device, researches on applying low power to perform the operations are being actively conducted. A case (a power dip or a sudden power off) where a voltage is not stably provided to the storage device easily occurs when operating with low power, a data loss may occur in this case, and there is a need for a technique for reducing or preventing this problem.

Furthermore, when the storage device operates at a high temperature or a low temperature, due to a change on the characteristics of the memory cells, a defense code entry ratio increases, the latency increases, and in order to lower the temperature when operating at a high temperature, a controller may forcibly lower the performance of the memory operation and lower the operation efficiency of the storage device.

SUMMARY

Aspects of the present disclosure provide a technique for controlling a storage device depending on the temperature of the storage device.

Aspects of the present disclosure provide a semiconductor package capable of maintaining reliability against a sudden drop in external voltage.

Aspects of the present disclosure also provide a semiconductor package having improved operation efficiency through a temperature control in the package.

Aspects of the present disclosure also provide an electronic device capable of maintaining reliability against a sudden drop in external voltage.

Aspects of the present disclosure also provide an electronic device having improved operation efficiency through a temperature control in a package.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

A semiconductor package for achieving the aforementioned aspects comprises a semiconductor chip on a substrate, a voltage measurement circuit configured to measure an external voltage to be input into the semiconductor chip and a thermoelectric module configured to convert heat released from the semiconductor chip into an auxiliary power, and configured to apply the auxiliary power to the semiconductor chip, the thermoelectric module being separated from the voltage measurement circuit, wherein the voltage measurement circuit is configured to control the thermoelectric module to apply the auxiliary power to the semiconductor chip in response to a change in the external voltage.

A semiconductor package for achieving the aforementioned aspects comprises a semiconductor chip on a substrate, a thermoelectric module configured to convert heat released from the semiconductor chip into an auxiliary power and configured to apply the auxiliary power to the semiconductor chip, a voltage measurement circuit configured to control the thermoelectric module to apply the auxiliary power to the semiconductor chip in response to a change in an external voltage to be input into the semiconductor chip and a temperature control circuit configured to transmit a control signal to the voltage measurement circuit in response to a providing temperature provided to the semiconductor chip, and provides a temperature control current to the thermoelectric module, wherein the voltage measurement circuit is configured to control the temperature control current provided to the thermoelectric module by the temperature control circuit, in accordance with the control signal.

A electronic device for achieving the aforementioned aspects comprises a first nonvolatile memory configured to store first data, a first thermoelectric module adjacent to the first nonvolatile memory, and configured to absorb heat released from the first nonvolatile memory to adjust a first providing temperature provided to the first nonvolatile memory, a first temperature control circuit configured to provide a first temperature control current to the first thermoelectric module in response to the first providing temperature; and a power management module configured to receive a control signal from the first temperature control circuit, is configured to adjust the temperature control current, and is configured to provide a first operating voltage to be input into the first nonvolatile memory, wherein the first thermoelectric module is configured to convert the heat released from the first nonvolatile memory into a first preliminary power, and the power management module is configured to control the first thermoelectric module to apply the first auxiliary power to the first nonvolatile memory, in response to a change in the first operating voltage.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EXAMPLE EMBODIMENTS

Figure 1:
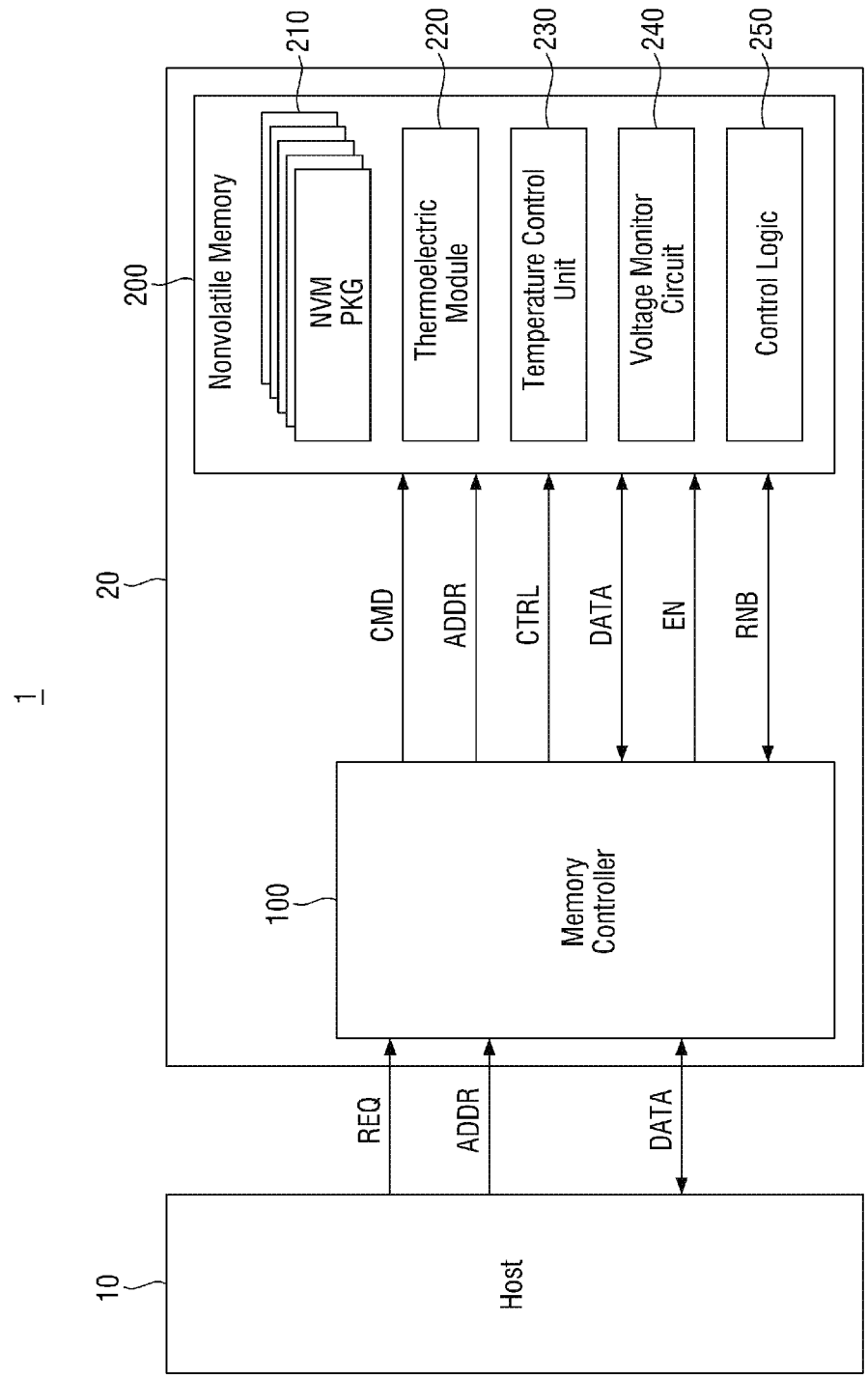
FIG. 1 is a block diagram showing a system including a storage device according to some example embodiments of the present disclosure.

Hereinafter, example embodiments according to the technical idea of the present disclosure will be described with reference to the accompanying drawings. In the description of FIGS. 1 to 17, the same or substantially the same components are denoted by the same reference numerals, and the repeated explanation of the components will not be provided.

Figure 2:
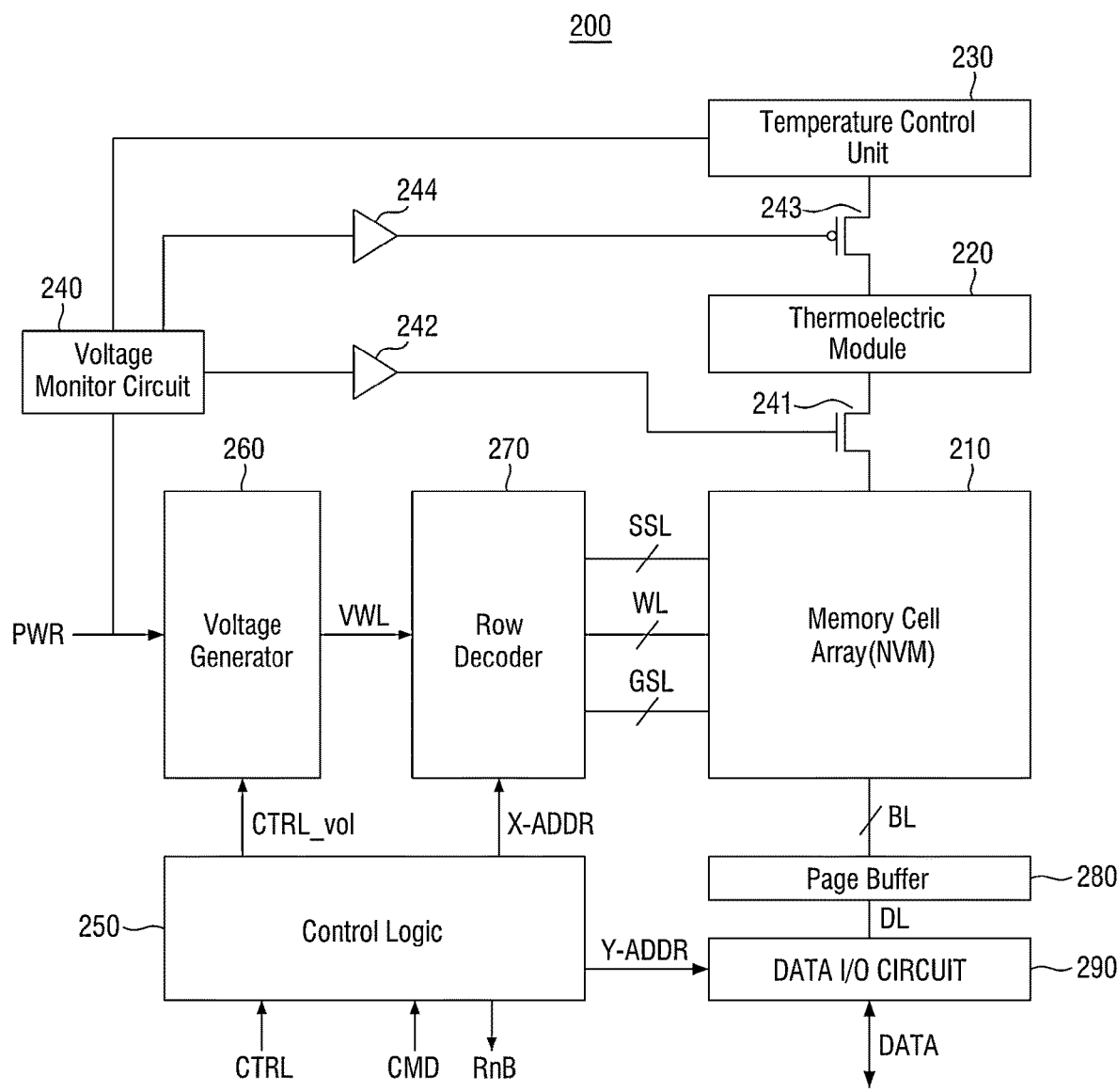
FIG. 2 is an example block diagram for explaining a memory of FIG. 1.

FIG. 1 is a block diagram showing a system including a storage device according to some example embodiments of the present disclosure. FIG. 2 is an example block diagram for explaining the memory of FIG. 1.

Referring to FIG. 1, a system 1 including the storage device according to some example embodiments of the present disclosure may include a host 10 and a storage device 20. Although the system 1 may include, for example, a flash memory-based data storage medium such as a memory card, a USB memory, and an SSD (Solid Status Drive) or an electronic device including the data storage medium, and a network system, the example embodiments are not limited to these examples.

The host 10 may transmit a data operation request REQ and an address ADDR to the memory controller 100, and may send and receive data DATA to and from the memory controller 100.

The storage device 20 may include a memory controller 100 and a memory 200.

The memory controller 100 may control the memory 200 in response to a request from the host 10. The memory controller 100 may, for example, read the data DATA stored in the memory 200 in response to the data operation request REQ received from the host 10, and may control the memory 200 to write data DATA into the memory 200. The memory controller 100 may provide an address ADDR, a command CMD and a control signal CTRL to the memory 200, and may control program, read and erase operations for the memory 200. Further, the data DATA for the program and the read data DATA may be transmitted and received between the memory controller 100 and the memory 200.

The memory 200 may output a ready and busy signal RNB. The ready and busy signal RNB may indicate the status of the memory 200. The memory controller 100 may provide the command CMD to the memory 200 when the memory 200 outputs, for example, a ready signal. The memory controller 100 may not provide the command CMD, for example, when the memory 200 outputs the busy signal.

Although not shown, according to some example embodiments, the memory controller 100 may also include configurations such as a thermoelectric module 220, a temperature control circuit 230, and/or a voltage measurement circuit 240 to be explained below in FIG. 2, to be adjacent to a data storage device included in the memory controller 100.

Hereinafter, explanation will be provided with reference to FIG. 2. Referring to FIGS. 1 and 2, the memory 200 may include a memory cell array 210, a thermoelectric module 220, a temperature control circuit 230, a voltage measurement circuit 240, a control logic 250, a voltage generator 260, a row decoder 270, a page buffer circuit 280, and/or a data I/O circuit 290.

Although the memory 200 may include, for example, a NAND flash memory, a vertical NAND flash memory (VNAND), a NOR flash memory, a resistive RAM (RRAM), a phase change memory (PRAM), a magnetoresistive memory (MRAM), a ferroelectric memory (FRAM), a spin torque transfer magnetic RAM (Spin STT-RAM), and the like, example embodiments are not limited to these examples.

The memory cell array 210 may include the plurality of memory blocks, and each of the plurality of memory blocks may include a plurality of memory cells connected to a plurality of word lines WL and a plurality of bit lines BL.

The memory cell array 210 may be connected to the row decoder 270 through a string selection line SSL, a plurality of word lines WL and/or a ground selection line GSL. In addition, the memory cell array 210 may be connected to the page buffer circuit 280 through a plurality of bit lines BL. In some example embodiments, the memory cell array 210 may be a three-dimensional memory cell array formed on a substrate in a three-dimensional structure (or vertical structure). In example embodiments, the memory cell array 210 may include vertical memory cell strings including a plurality of memory cells formed by stacking each other. The memory cell array 210 may be a two-dimensional memory cell array formed on a substrate in a two-dimensional structure (or a horizontal structure), without being limited thereto.

Figure 3:
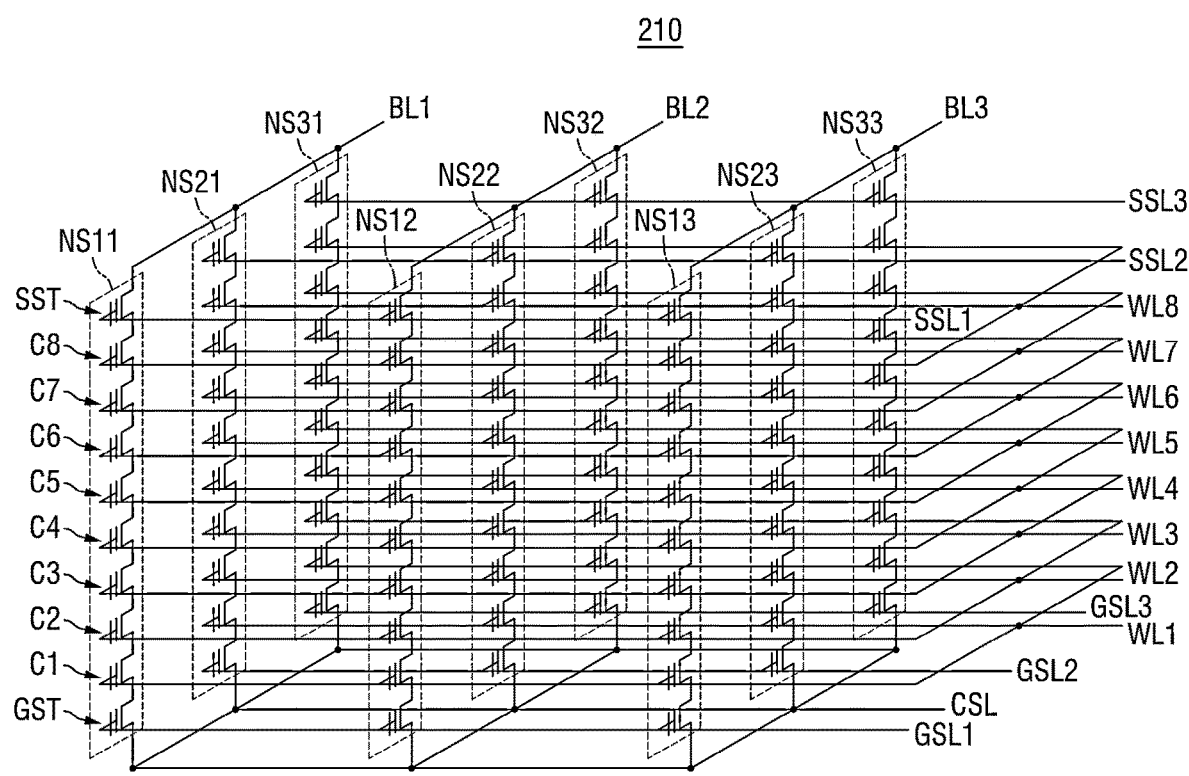
FIG. 3 is an example circuit diagram for explaining a memory cell array in a storage device including a semiconductor package according to some example embodiments.

The memory cell array 210 will be described in detail with reference to FIG. 3. The memory cell array 210 may include a plurality of memory cell strings NS11 to NS33 connected between the bit lines BL1 to BL3 and the common source line CSL. Each of the plurality of memory cell strings NS11 to NS33 may include a string selection transistor SST, a plurality of memory cells MC1, MC2, . . . , MC8 and a ground selection transistor GST. Although FIG. 3 shows that the plurality of memory cell strings NS11 to NS33 each includes eight memory cells MC1 to MC8, the number and type thereof are not limited thereto.

The string selection transistor SST may be connected to the corresponding string selection line SSL. Each of a plurality of memory cells MC1, MC2, . . . , MC8 may be connected to corresponding word lines WL1, WL2, . . . , WL8. The ground selection transistor GST may be connected to the corresponding ground select lines GSL1 to GSL3. The string selection transistor SST may be connected to the corresponding bit lines BL1 to BL3, and the ground selection transistor GST may be connected to the common source line CSL. Although FIG. 3 shows that the memory cell array 210 is connected to eight word lines WL1 to WL8 and three bit lines BL1 to BL3, the present disclosure is not limited thereto.

Referring again to FIGS. 1 and 2, a thermoelectric module 220 according to some example embodiments may be connected to the memory cell array 210 through the first transistor 241, and may be connected to the temperature control circuit 230 through the second transistor 243. Although the first transistor 241 is shown as an NMos transistor, and the second transistor 243 is shown as a PMos transistor, as long as it is possible to control the current input to and output from the thermoelectric module 220, they may be replaced with other types of transistors, switches, variable resistors, and the like, but example embodiments of the present disclosure are not limited to these examples.

The thermoelectric module 220 includes a thermoelectric element and may absorb or release heat around the thermoelectric element, depending on the direction of the temperature control current input by the Peltier effect. Further, the thermoelectric element may generate a current due to a temperature variation around the thermoelectric element by the Seebeck effect, and may generate a power through the generated current. The thermoelectric element may include a thermoelectric semiconductor, and the thermoelectric semiconductor may include, for example, Bi—Te, Pb—Te, Fe—Si, Si—Ge, Mg—Si, Sn—Se and the like. The detailed structure will be explained below in FIGS. 5 to 7.

The thermoelectric module 220 according to some example embodiments may convert an ambient temperature variation due to heat generated by the memory cell array 210 into an auxiliary power by the Seebeck effect. That is, it is possible to absorb the heat generated by the memory cell array 210, input the current into the memory cell array 210, and generate a power in the memory cell array 210.

The thermoelectric module 220 according to some example embodiments may also input a current into the memory cell array 210 to enhance the power of the memory cell array 210 and increase heat generated from the memory cell array 210.

The thermoelectric module 220 according to some example embodiments may absorb heat around the memory cell array 210 through a temperature control current input from the temperature control circuit 230 by a Peltier effect, and cool the memory cell array 210.

The temperature control circuit 230 according to some example embodiments may be connected to the thermoelectric module 220 through the second transistor 243, and may be connected to the voltage measurement circuit 240.

The temperature control circuit 230 according to some example embodiments may measure the temperature provided to the memory cell array 210 and the temperature provided to the thermoelectric module 220. A control signal may be provided to the voltage measurement circuit 240 through the measured temperature.

The temperature control circuit 230 according to some example embodiments may operate as a current source in the thermoelectric module 220 to input a temperature control current into the thermoelectric module 220. The thermoelectric module 220 may absorb the heat generated by the memory cell array 210 according to the input temperature control current.

The voltage measurement circuit 240 according to some example embodiments is connected to the temperature control circuit 230, and may be connected to each of the first transistor 241 and the second transistor 243, through each of a first inverter 242 and a second inverter 244. According to some example embodiments, the voltage measurement circuit 240 may be connected to the first transistor 241 and the second transistor 243, without passing through the first inverter 242 and the second inverter 244.

The voltage measurement circuit 240 according to some example embodiments may measure an external voltage PWR which is input into the memory 200. Although the external voltage is input only to the voltage generator 260, it may be input in parallel to the configuration included in the memory 200. It is possible to detect that a Power dip or a Sudden Power Off occurs in the external voltage.

The voltage measurement circuit 240 according to some example embodiments may control the first transistor 241 and the second transistor 243 according to a control signal input from the temperature control circuit 230. The specific operation of the voltage measurement circuit 240 will be explained below in FIGS. 8 to 11.

The control logic 250 may generally control the memory 200, on the basis of the command CMD, the address ADDR, and the control signal CTRL received from the memory controller 100. The control logic 250 may control, for example, the write operation, the read operation, and the erase operation of the memory 200. The control logic 250 may output a ready signal and busy signal RNB indicating the status of the memory 200.

The control logic 250 may provide a voltage control signal CTRL_vol to the voltage generator 260. The control logic 250 may generate a row address X-ADDR and a column address Y-ADDR on the basis of the address signal ADDR. The control logic 250 may provide the row address X-ADDR to the row decoder 270, and may provide the column address Y-ADDR to the data I/O circuit 290.

The voltage generator 260 may generate an operating voltage required for operating the memory 200 in response to the voltage control signal CTRL_vol. The operating voltage may include, for example, but is not limited to, a word line voltage VWL, a program voltage, a read voltage, a verifying voltage, an erasing voltage and the like.

The row decoder 270 may be connected to the memory cell array 210 through the string selection line SSL, the word line WL and the ground selection line GSL. The row decoder 270 may select the string selection line SSL, the word line WL and the ground selection line GSL in response to the row address X-ADDR. The row decoder 270 may apply the operating voltage, which is provided from the voltage generator 260, to selected and unselected string selection line SSL, the word line WL and the ground selection line GSL.

The page buffer circuit 280 may be connected to the memory cell array 210 through the plurality of bit lines BL. The page buffer circuit 280 may include a plurality of page buffers. The page buffer circuit 280 may temporarily store the data to be written in the selected page at the time of the write operation. The page buffer circuit 280 may temporarily store the data read from the selected page at the time of the read operation.

The data I/O circuit 290 may be connected to the page buffer circuit 280 through the data line DL. The data I/O circuit 290 may receive, for example, write data DATA from the memory controller 100 at the time of the write operation, and may provide the write data DATA to the page buffer circuit 280, on the basis of the column address Y-ADDR provided from the control logic 250. The data I/O circuit 290 may provide, for example, read data DATA stored in the page buffer circuit 280 to the memory controller 100, on the basis of the column address Y-ADDR provided from the control logic 250 at the time of the read operation.

Figure 4:
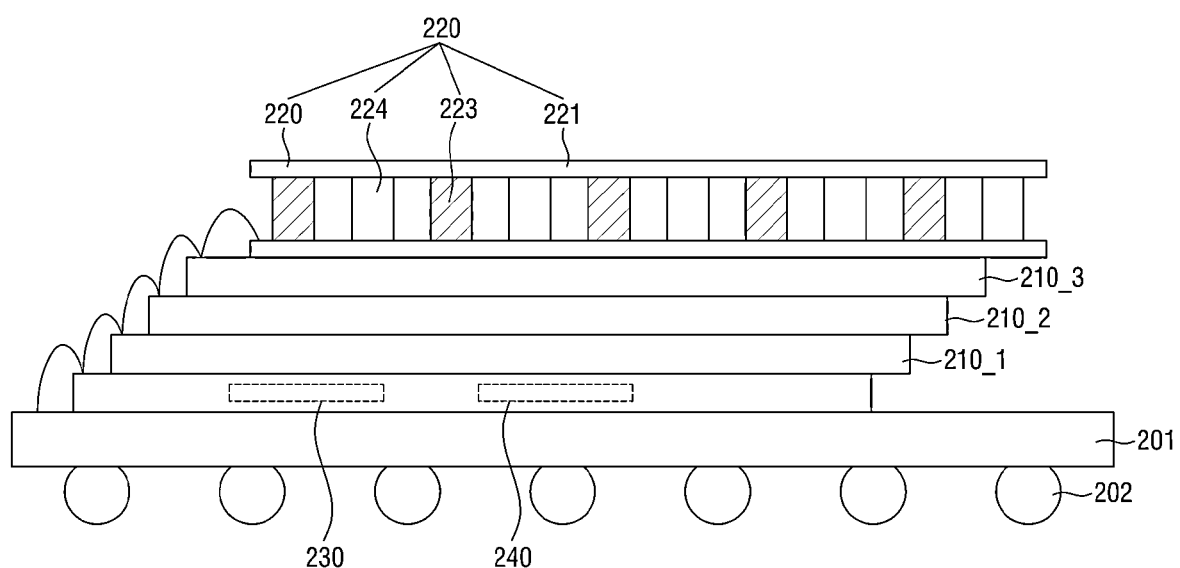
FIG. 4 is an example diagram for explaining the semiconductor package according to some example embodiments.

FIG. 4 is an example diagram for explaining a semiconductor package according to some example embodiments.

Referring to FIG. 4, a semiconductor package 1000a according to some example embodiments may include first to third memory cell array 210_1 to 210_3, a thermoelectric module 220, a temperature control circuit 230, and/or a voltage measurement circuit 240. Although not shown, other configurations included in the memory 200 of FIG. 2 may also be included in the semiconductor package 1000a.

The first to third memory chips 210_1 to 210_3, the thermoelectric module 220, the temperature control circuit 230 and/or the voltage measurement circuit 240 may be disposed on the single same substrate 201. A plurality of external connection terminals 202 may be formed below the substrate 201 to receive external electric signals. The plurality of external connection terminals 202 may include gold (Au), silver (Ag), copper (Cu), nickel (Ni) or aluminum (Al).

Each of the first to third memory chips 210_1 to 210_3 according to some example embodiments may include a three-dimensional array structure, and may include a NAND flash memory, a vertical NAND flash memory (Vertical NAND: VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), and the like. Further, it may be called a semiconductor memory chip including the semiconductor device.

The thermoelectric module 220 may be disposed on the first to third memory chips 210_1 to 210_3. The detailed structure of the thermoelectric module 220 will be explained below in FIGS. 5 to 7. The temperature control circuit 230 and the voltage measurement circuit 240 may be disposed on the same chip below the first to third memory chips 210_1 to 210_3, but may be disposed in another stack in the same package as the third memory chips 210_1 to 210_3, without being limited thereto, and the placement of FIG. 4 related to the placement of the temperature control circuit 230 and the voltage measurement circuit 240 corresponds to an example.

Figure 5:
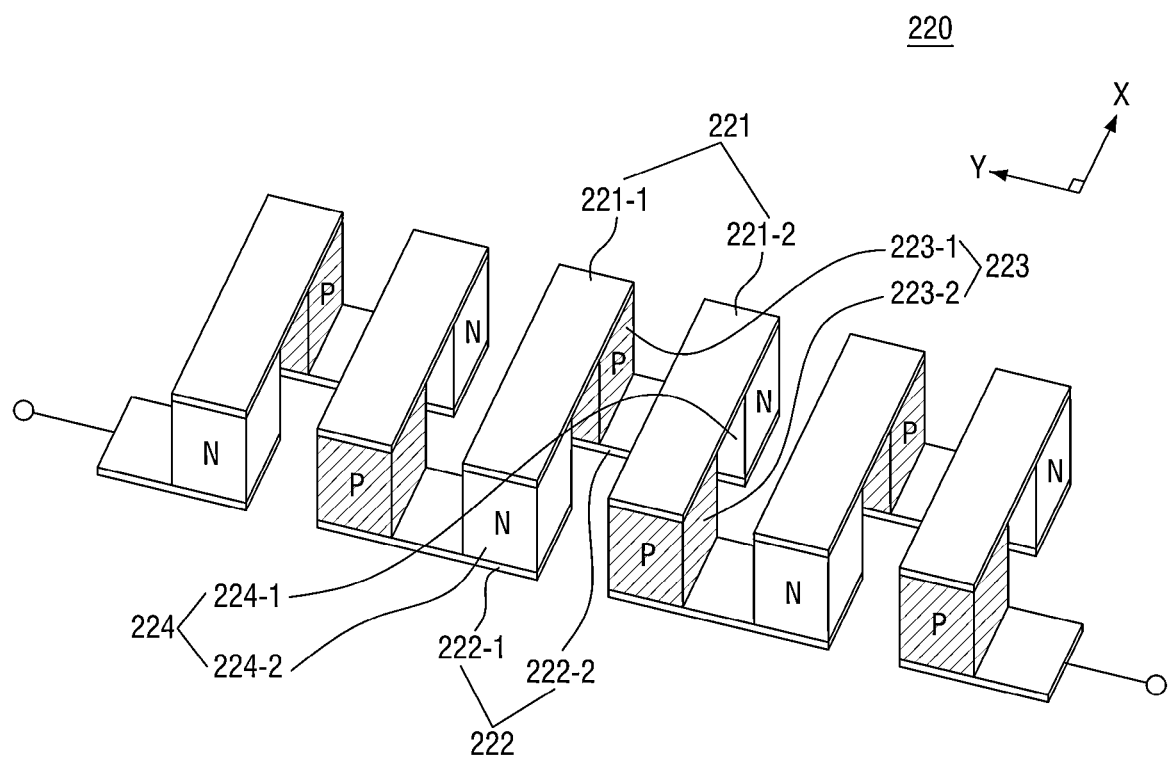
FIG. 5 is a perspective view showing a thermoelectric module of FIG. 4 according to some example embodiments.
Figure 6:
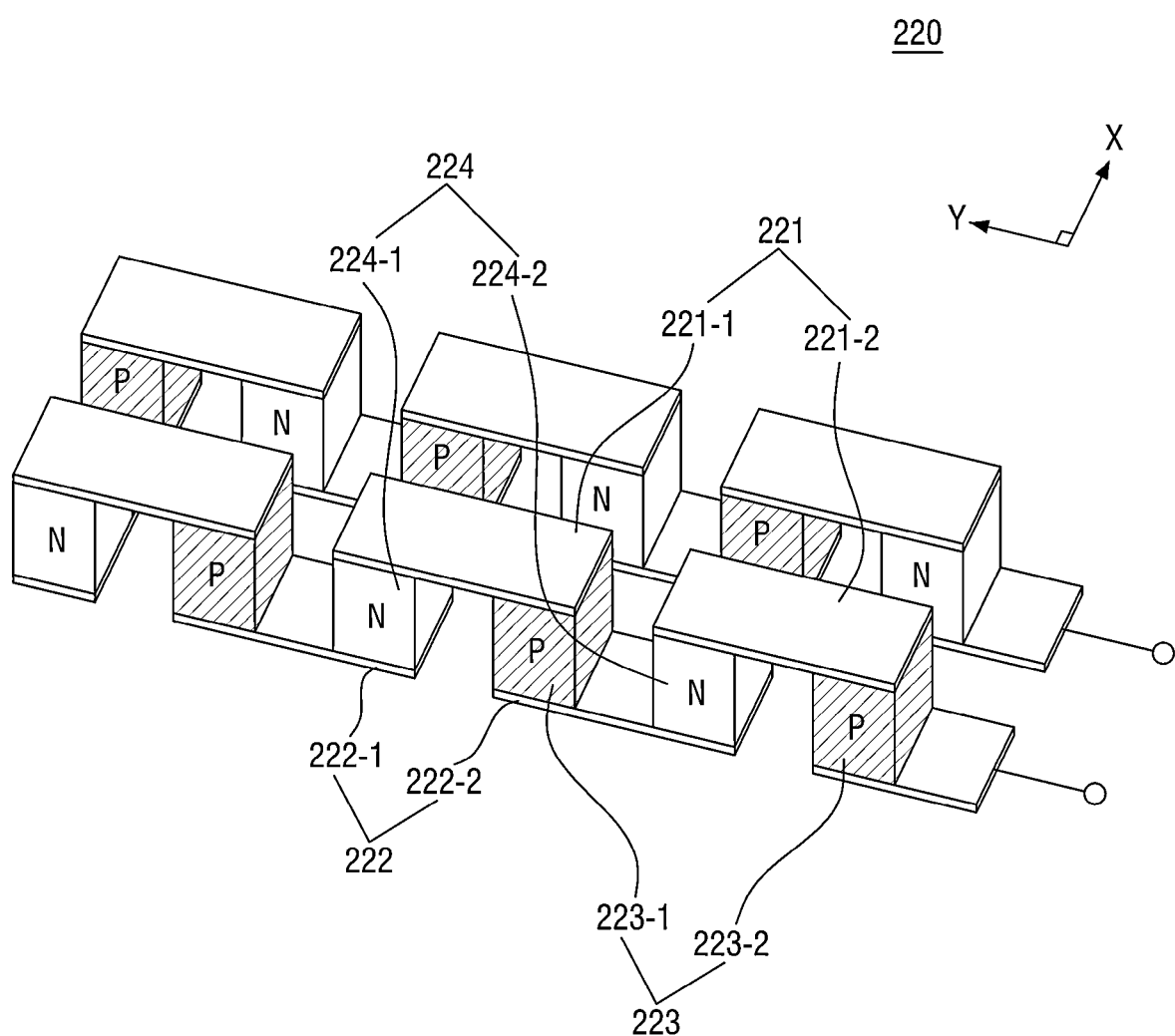
FIG. 6 is a perspective view showing the thermoelectric module of FIG. 4 according to some other example embodiments.
Figure 7:
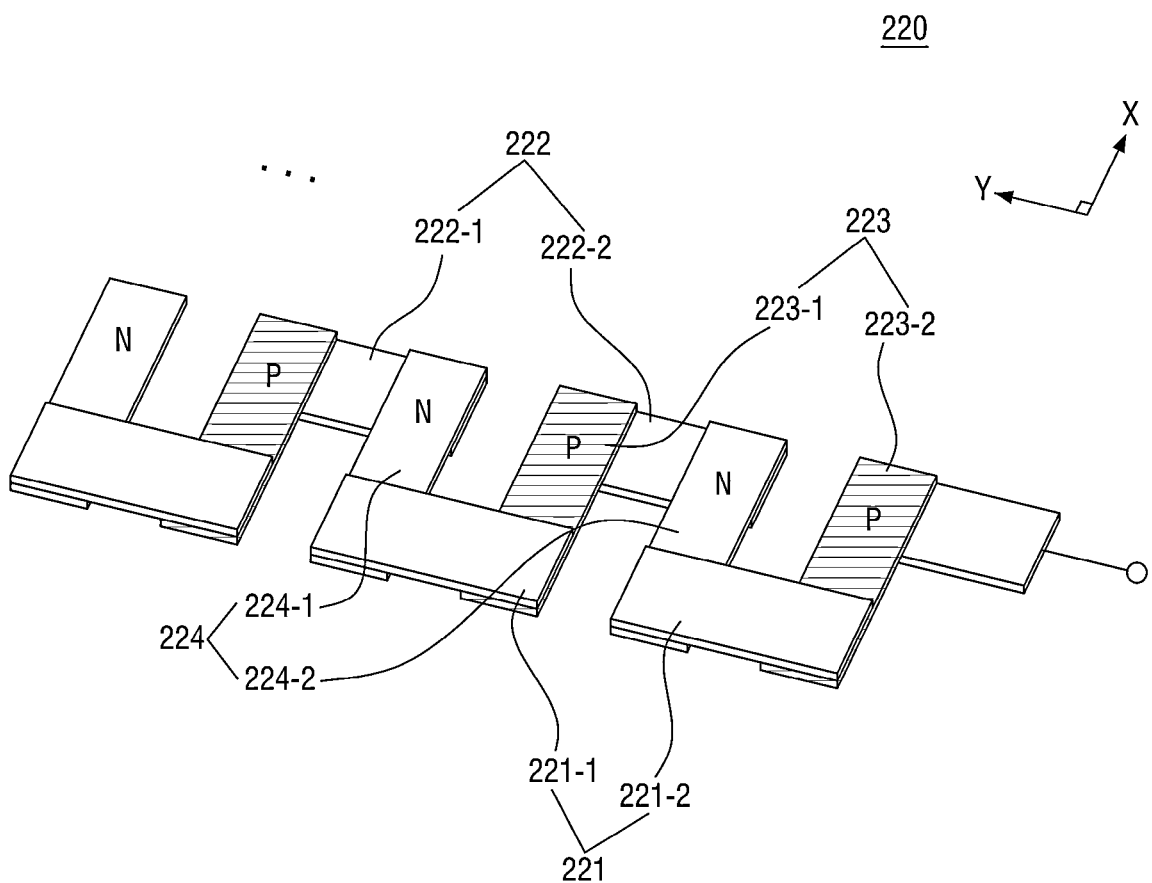
FIG. 7 is a perspective view showing the thermoelectric module of FIG. 4 according to some other example embodiments.

The first to third memory chips 210_1 to 210_3, the thermoelectric module 220, the temperature control circuit 230 and/or the voltage measurement circuit 240 may be connected to each other by metal wires, and may be connected to a plurality of external connection terminals 202 through second metal wires FIG. 5 is a perspective view showing a thermoelectric module 220 of FIG. 4 according to some example embodiments. FIG. 6 is a perspective view showing the thermoelectric module 220 of FIG. 4 according to some other example embodiments. FIG. 7 is a perspective view showing the thermoelectric module 220 of FIG. 4 according to some other example embodiments.

Referring to FIG. 5, a pair of P-type semiconductors 223 and N-type semiconductors 224 arranged in the X direction constitute a single thermocouple, and a plurality of thermocouples is arranged in the Y direction and may be included in the module 220. The thermoelectric module 220 may have improved heat exchange performance and capacity by including the plurality of thermocouples. The positions of the P-type semiconductors 223 and the N-type semiconductors 224 of the adjacent thermocouples arranged in the Y direction may be reversed, and thus, the P-type semiconductors 223 and the N-type semiconductors 224 may be arranged alternately along the Y direction. The P-type semiconductor 223 and the N-type semiconductor 224 forming one thermocouple may be joined to each other by the first metal film 221. The P-type semiconductor 223 belonging to one of the thermocouples may be joined to the N-type semiconductor 224 belonging to another adjacent thermocouple by the second metal film 222.

A voltage is applied through the second metal film 222 joined to the P-type semiconductor 223 of the first thermocouple and the second metal film 222 joined to the N-type semiconductor 224 of the last thermocouple to generate a current. The current generated through the thermoelectric module 220 by the Peltier effect causes the movement of heat. A movement direction of the flowing heat may vary depending on the polarity of the applied voltage.

In contrast, when a first providing temperature is provided to the first metal film 221 and a second providing temperature is provided to the second metal film 222, the current may be generated in the first metal film 221 and the second metal film 222 by the Seebeck effect. The direction of the current may vary depending on the temperature comparison between the first providing temperature and the second providing temperature.

FIG. 6 is a modified example of FIG. 5. Differences from the thermoelectric module 220 shown in FIG. 5 will be mainly described. Referring to FIG. 6, a pair of P-type semiconductors 223 and N-type semiconductors 224 arranged in the Y direction constitutes a single thermocouple, and a plurality of thermocouples may be arranged in the Y direction and included in the module 220. The positions of the P-type semiconductors 223 and N-type semiconductors 224 of the adjacent thermocouples arranged in the X direction may be reversed, and thus, the P-type semiconductors 223 and the N-type semiconductors 224 may be arranged alternately along the Y direction. The X and Y directions may be changed from each other.

FIG. 7 is a modified example of FIG. 6. Differences from the thermoelectric module 220 shown in FIG. 6 will be mainly described. Referring to FIG. 7, as in the example embodiments of FIG. 6, a pair of P-type semiconductors 223 and N-type semiconductors 224 arranged in the Y direction form a single thermocouple, and a plurality of thermocouples may be arranged in the Y direction and included in the thermoelectric module 220.

However, the P-type semiconductor 223 and the N-type semiconductor 224 extend in the Y direction, and may partially overlap the first metal film 221 and the second metal film 222 from a planar viewpoint, and the first metal film 221 and the second metal film 222 may not overlap each other in a plan view.

Figure 8:
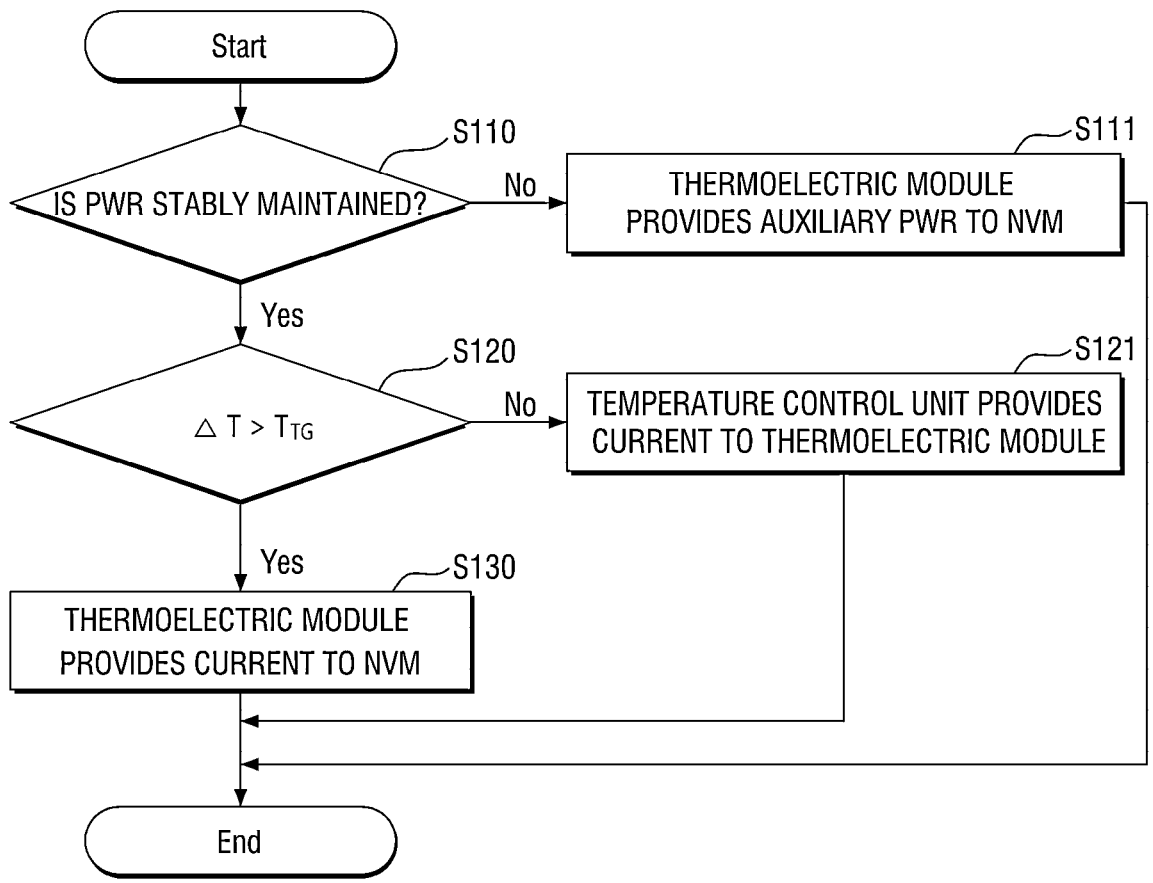
FIG. 8 is a flowchart for explaining the operation of the semiconductor package according to some example embodiments.
Figure 9:
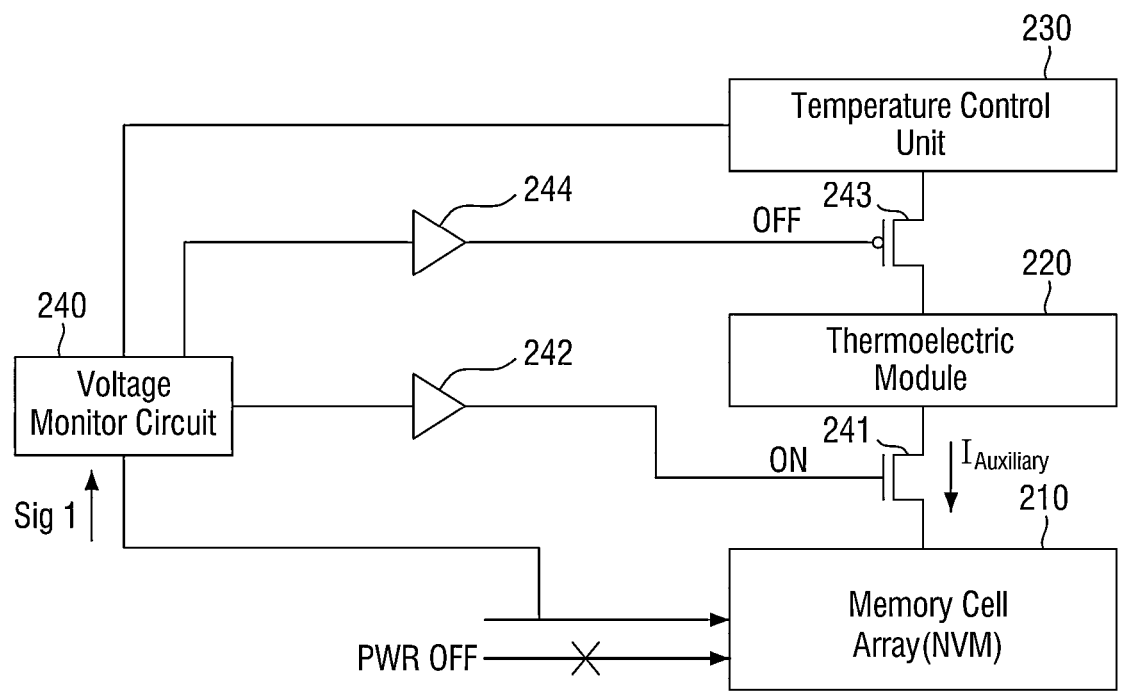
FIG. 9 is a diagram for explaining the operation of S110 and S111 of FIG. 8.
Figure 10:
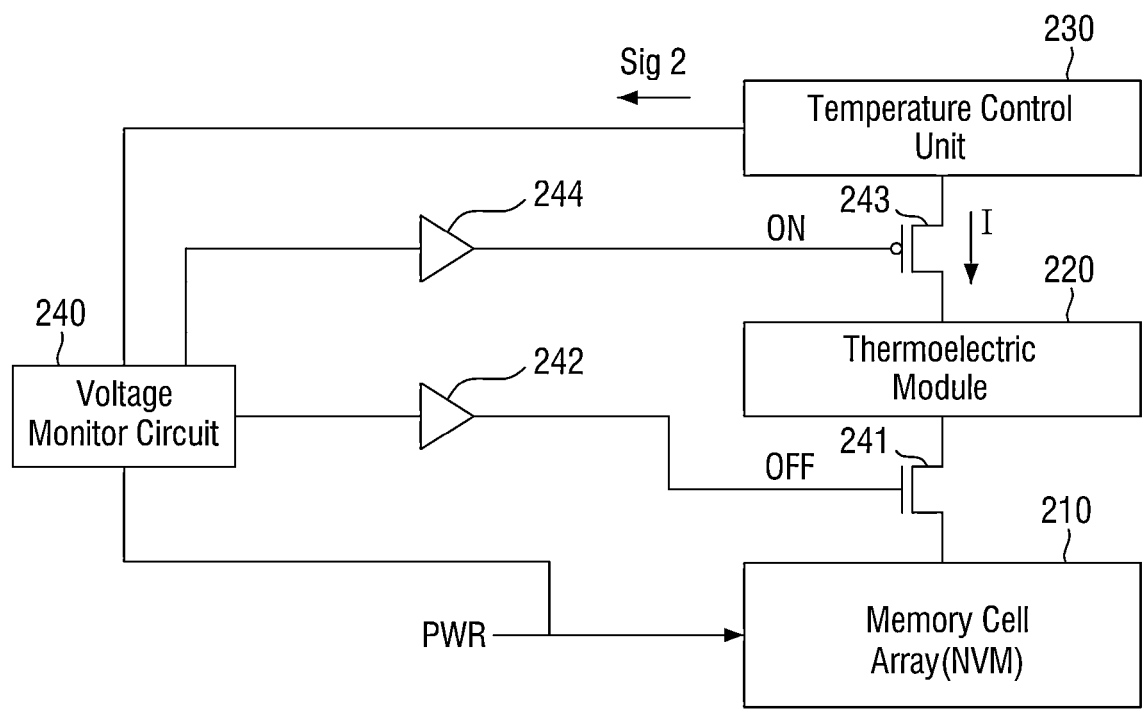
FIG. 10 is a diagram for explaining the operation of S120 and S121 of FIG. 8.
Figure 11:
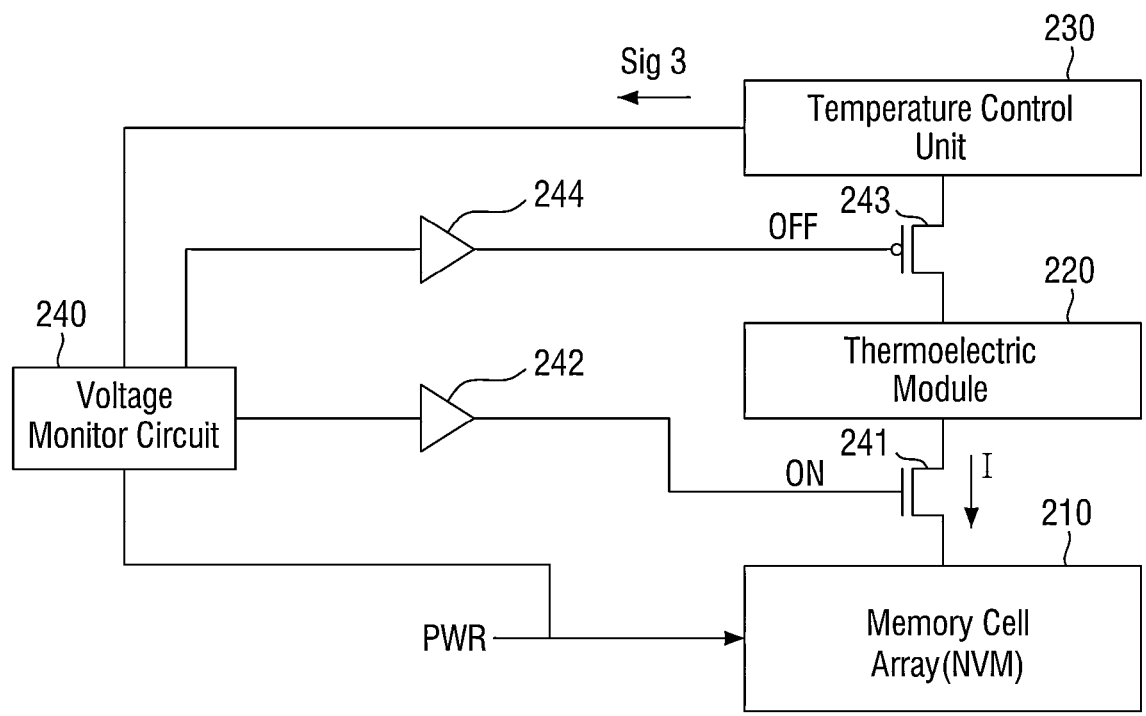
FIG. 11 is a diagram for explaining the operation of S120 and S130 of FIG. 8.

FIG. 8 is a flowchart for explaining the operation of the semiconductor package according to some example embodiments. FIG. 9 is a diagram for explaining the operation of S110 and S111 of FIG. 8. FIG. 10 is a diagram for explaining the operation of S120 and S121 of FIG. 8. FIG. 11 is a diagram for explaining the operation of S120 and S130 of FIG. 8.

Referring to FIGS. 8 and 9, the voltage measurement circuit may measure whether the voltage input to the memory cell array is stably maintained (S110).

The thermoelectric module 220 provides the auxiliary power to the memory cell array 210 (S111). When the voltage PWR is not stably maintained (Power dip or Sudden Power Off), the voltage measurement circuit 240 may turn on the first transistor 241 and turn off the second transistor 243 through the first inverter 242 and the second inverter 244.

The thermoelectric module 220 may convert the heat absorbed by the memory cell array 210 into an auxiliary current $I_{Auxiliary}$, and input the auxiliary current $I_{Auxiliary}$ into the memory cell array 210 through the second transistor 243 to provide the auxiliary power.

Additionally referring to FIGS. 4 and 10, the temperature control circuit 230 checks whether the temperature variation between the first providing temperature and the second providing temperature is larger than a target temperature variation (S120).

When the voltage PWR is maintained stably, the temperature control circuit 230 may check whether a temperature variation ΔT between a first providing temperature T1 provided to the first metal film 221 of the thermoelectric module 220 and a second providing temperature T2 provided to the second metal film 222 is greater than a magnitude of a preset target temperature variation $T_{TG}$.

When the temperature variation between the first providing temperature and the second providing temperature is greater than the magnitude of the target temperature variation, the temperature control circuit may input the temperature control current into the thermoelectric module (S121). The temperature control circuit 230 may input the second control signal Sig 2 into the voltage measurement circuit 240, and perform control to turn off the first transistor 241 and turn on the second transistor 243.

The temperature control circuit 230 may input the temperature control current I into the thermoelectric module 220 through the second transistor 243. The thermoelectric module 220 may receive the temperature control current and absorb the heat released from the memory cell array 210 to reduce the temperature provided to the memory cell array 210.

Additionally referring to FIGS. 4 and 11, when the temperature variation between the first providing temperature and the second providing temperature is smaller than the target temperature variation, the thermoelectric module provides the auxiliary power to the memory cell array (S130).

The temperature control circuit 230 may input the third control signal Sig 3 into the voltage measurement circuit 240 and perform a control to turn on the first transistor 241 and turn off the second transistor 243.

The thermoelectric module 220 may convert the heat absorbed by the memory cell array 210 into a current I and input the current into the memory cell array 210 to increase the temperature provided to the memory cell array 210.

Figure 12:
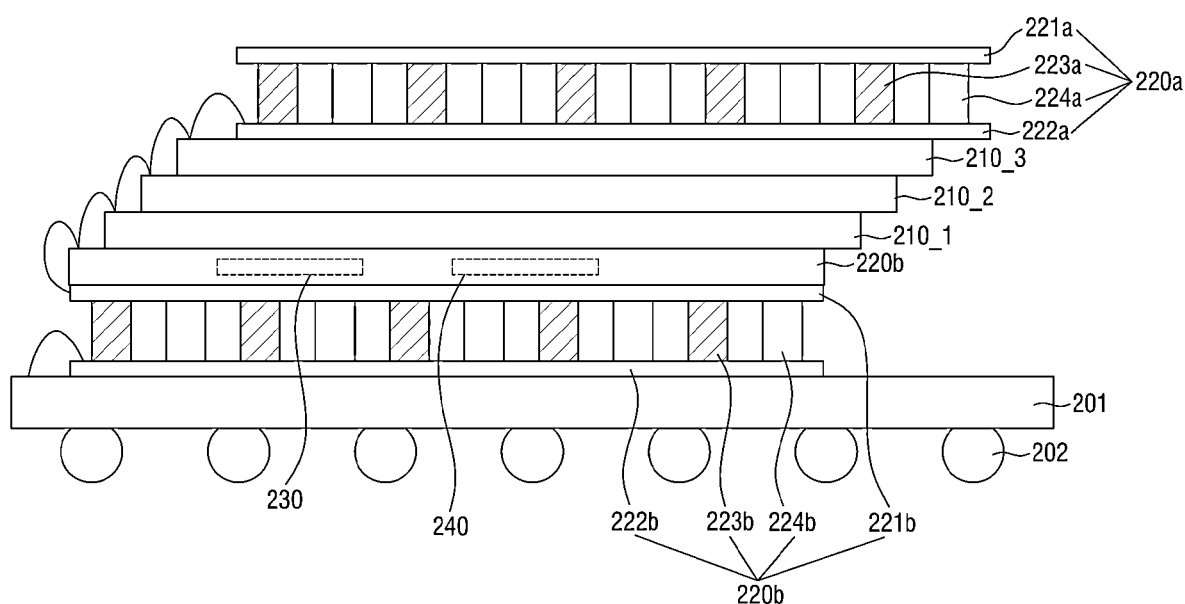
FIGS. 12 to 14 are example views showing the semiconductor package according to some other example embodiments.
Figure 13:
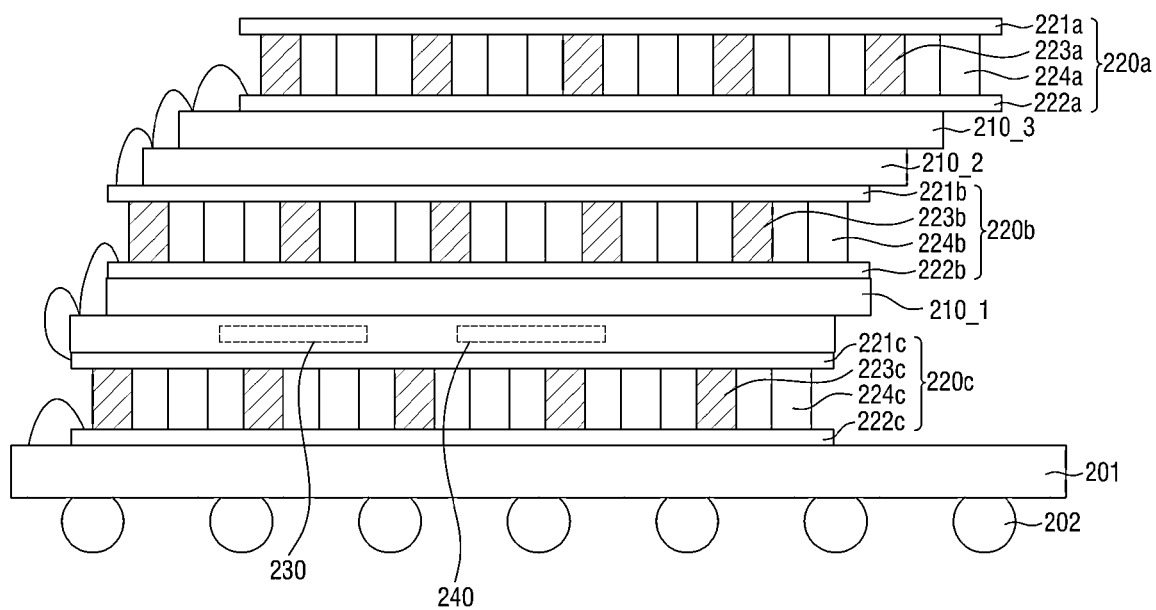
Figure 14:
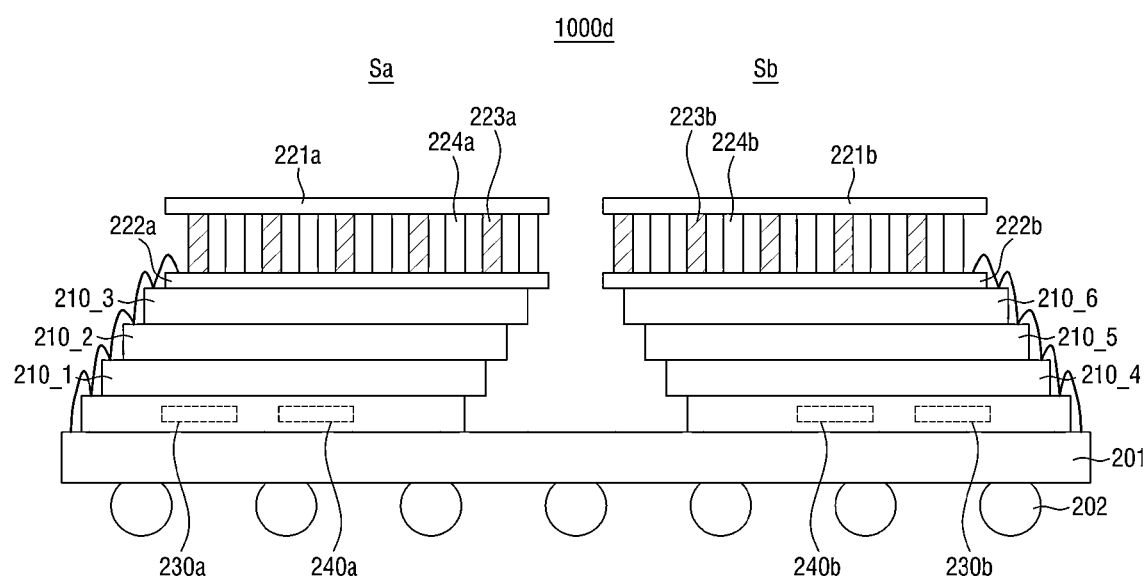

FIGS. 12 to 14 are example views showing a semiconductor package according to some other example embodiments. FIGS. 12 to 14 are modified examples of FIG. 4. Differences from the thermoelectric module 220 shown in FIG. 4 will be mainly described.

Referring to FIG. 12, the thermoelectric module 220 may include a first thermoelectric module 220a and a second thermoelectric module 220b. The first thermoelectric module 220a includes a first metal film 221a, a second metal film 222a, a P-type semiconductor 223a and/or an N-type semiconductor 224a as in the thermoelectric module 220 of FIG. 4, and may be disposed on the first to third memory chips 210_1 to 210_3.

The second thermoelectric module 220b includes a first metal film 221b, a second metal film 222b, a P-type semiconductor 223b and/or an N-type semiconductor 224b as in the thermoelectric module 220 of FIG. 4, and may be included between the first to third memory chips 210_1 to 210_3 and the substrate 201.

Referring to FIG. 13, when compared with the thermoelectric module 220 of FIG. 12, the thermoelectric module 220 of FIG. 13 may further include a third thermoelectric module 220c. Although the third thermoelectric module 220c may include a first metal film 221c, a second metal film 222c, a P-type semiconductor 223c and an N-type semiconductor 224c, may be disposed between the first to third memory chips 210_1 to 210_3. Although the third thermoelectric module 220c is shown as being disposed between the first memory chip 210_1 and the second memory chip 210_2, example embodiments are not limited thereto Referring to FIG. 14, a semiconductor package 1000d may include a first stack Sa and a second stack Sb on a substrate 201. The first stack Sa may include first to third memory cell arrays 210_1 to 210_3, a first thermoelectric module 220a, a first temperature control circuit 230a, and/or a first voltage measurement circuit 240a, as in the semiconductor package 1000a of FIG. 4.

The second stack Sb may include fourth to sixth memory cell arrays 210_4 to 210_6, a second thermoelectric module 220b, a second temperature control circuit 230b, and/or a second voltage measurement circuit 240b, as in the first stack Sa.

Each of the first thermoelectric module 220a and the second thermoelectric module 220b may be provided on each of the first to third memory cell arrays 210_1 to 210_3, and the fourth to sixth memory cell arrays 210_4 to 210_6.

The first stack Sa and the second stack Sb may be electrically connected to each other through the substrate 201, a metal wire or the like. Although the first stack Sa and the second stack Sb are separated into first and second temperature control circuits 230a and 230b for the temperature control circuit 230, and are separated into the first and second voltage measurement circuits 240a and 240b for the voltage measurement circuit 240, example embodiments are not limited thereto, and the first stack Sa and the second stack Sb may be implemented as each of a single temperature control circuit 230 and a single voltage measurement circuit 240 according to example embodiments.

Figure 15:
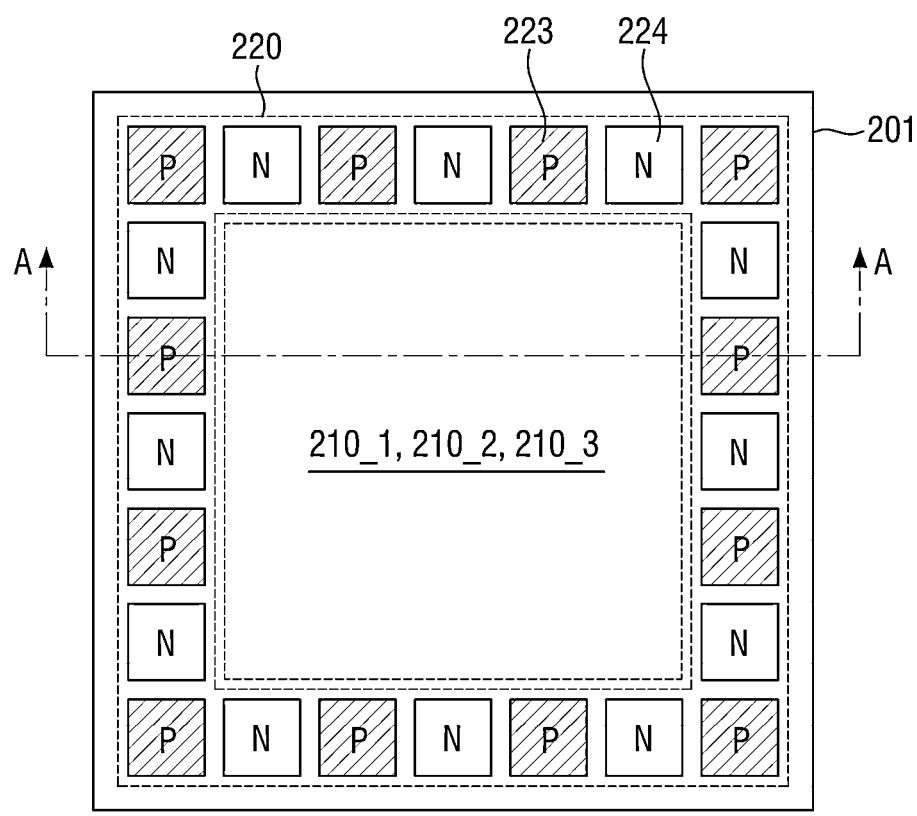
FIG. 15 is an example plan view showing the semiconductor package according to some other embodiments.
Figure 16:
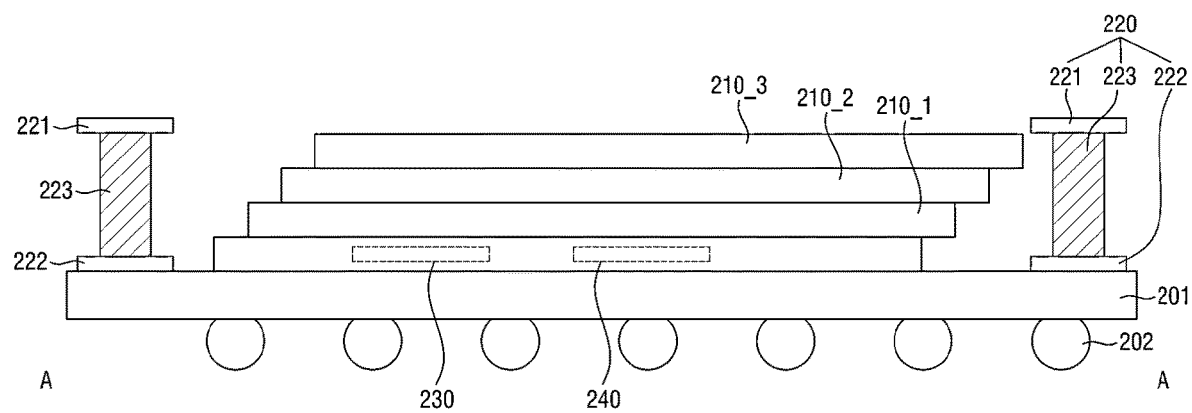
FIG. 16 is a diagram of the semiconductor package of FIG. 15 taken along a line A-A.

FIG. 15 is an example plan view showing a semiconductor package according to some other example embodiments in a planar viewpoint. FIG. 16 is a view of the semiconductor package of FIG. 15 taken along a line A-A. FIG. 15 is a modified example of FIG. 4. Differences from the thermoelectric module 220 shown in FIG. 4 will be mainly described.

Referring to FIGS. 15 and 16, the thermoelectric module 220 may be provided in a form extending along the edge of the substrate 201. The thermoelectric module 220 includes P-type semiconductors 223 and N-type semiconductors 224 arranged alternately along the edge of the substrate 201, and may have a loop shape surrounding the sidewalls of the first memory chip to the third memory chip 210_1 to 210_3. Although the P-type semiconductors 223 and the N-type semiconductors 224 may be arranged in a line along the edge of the substrate 201, they may be arranged in a plurality of lines (e.g., two lines), without being limited thereto.

Further, the upper surface of the first metal film 221 and the upper surface of the third memory chip 210_3 may form the same plane, and the lower surface of the second metal film 222 and the substrate 201 may be in contact with each other.

Figure 17:
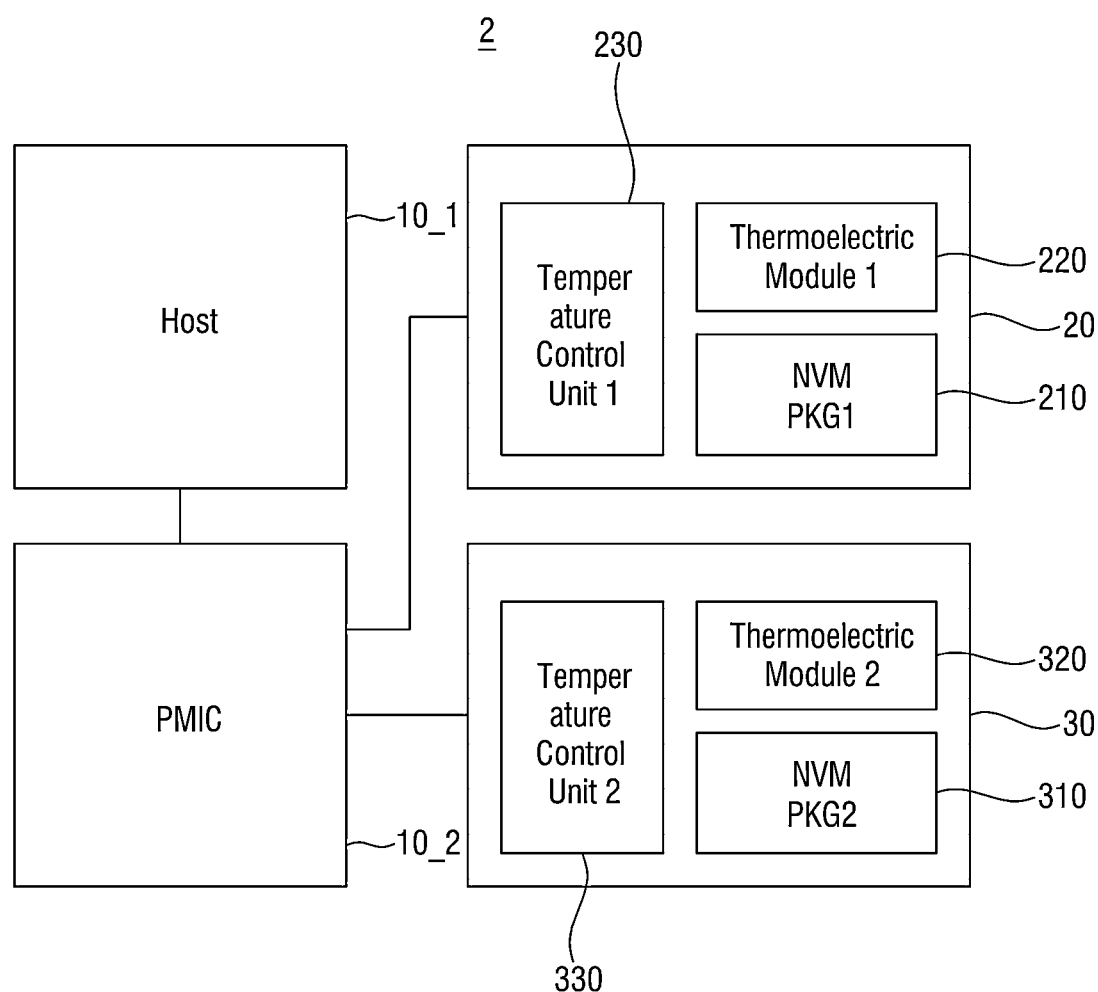
FIG. 17 is a block diagram showing a system including a storage device according to some other example embodiments.

FIG. 17 is a block diagram showing a system including a storage device according to another example embodiment. FIG. 17 is a modified example of FIGS. 1 and 2.

A system 2 may include a host 10_1, a PMIC (Power Management Integrated Circuit) 10_2, a first storage device 20, and/or a second storage device 30.

The host 10_1 may transmit a data operation request REQ and an address ADDR to the first storage device 20 and the second storage device 30, similarly to the first host 10 of FIG. 1, and may send and receive data DATA to and from the first storage device 20 and the second storage device 30.

The PMIC 10_2 is connected to a power supply source (e.g., a battery) and may control the level of power distributed to each component of the system 2. Although the PMIC 10_2 is separated from the host 10_1, the PMIC 10_2 may be included in the host 10_1, without being limited thereto. For example, although not shown, the PMIC 10_2 may control the level of the voltage applied to each of an antenna, a modem, an RF circuit, a processor, a temperature sensor, a first storage device 20 and a second storage device 30 included in the system 2, in response to a control signal received from a power management unit (PMU).

The PMIC 10_2 may control and measure the first external voltage and the second external voltage which are each input into the first memory cell array 210 and the second memory cell array 310.

The PMIC 10_2 may control each of the currents to be input into and output from the first and second thermoelectric modules 220 and 320 in accordance with control signals input from the first and second temperature control circuits 230 and 330. The PMIC 10_2 may adjust the first and second auxiliary currents $I_{Auxiliary}$ output from the first and second thermoelectric modules 220 and 320 to control the auxiliary power applied to each of the first memory cell array 210 and the second memory cell array 310.

Each of the first storage device 20 and the second storage device 30 may include the first and second memory cell arrays 210 and 310, first and second thermoelectric modules 220 and 320, and/or first and second temperature control circuits 230 and 330, as in the storage device 20 of FIGS. 1 and 2.

Unlike the storage device 20 of FIGS. 1 and 2, the first storage device 20 and the second storage device 30 do not include a voltage measurement circuit, and instead, a PMIC 10_2 may serve functions of the voltage measurement circuit of FIGS. 1 and 2.

The system according to some example embodiments of the present disclosure may stably supply voltage (e.g., power). By utilizing the Seebeck effect of the thermoelectric module 220 according to example embodiments, when a certain level of power supply is not smooth, the auxiliary power may be supplied to the memory cell array 210 to enhance the reliability of the storage device 20.

The system according to some example embodiments of the present disclosure may reduce a temperature variation in the memory cell array 210 and reduce the latency of the storage device 20, using the Peltier effect of the thermoelectric module 220, thereby improving the performance.

Further, when the temperature variation is small, the current is additionally supplied to the storage device 20, using the Seebeck effect of the thermoelectric module 220, which enables a low power consumption effect to be used efficiently.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the preferred example embodiments without substantially departing from the principles of the present disclosure. Therefore, the disclosed preferred example embodiments of the disclosure are used in a generic and descriptive sense only and not for purposes of limitation.

What is claimed is:

1. A semiconductor package comprising:
   a semiconductor chip on a substrate;
   a voltage measurement circuit configured to measure an external voltage to be input into the semiconductor chip; and
   a thermoelectric module configured to convert heat released from the semiconductor chip into an auxiliary power, and configured to apply the auxiliary power to the semiconductor chip, the thermoelectric module being separated from the voltage measurement circuit,
   wherein the voltage measurement circuit is configured to control the thermoelectric module to apply the auxiliary power to the semiconductor chip in response to a change in the external voltage.

2. The semiconductor package of claim 1, wherein the thermoelectric module is on the semiconductor chip.

3. The semiconductor package of claim 1, wherein the thermoelectric module includes a first thermoelectric module and a second thermoelectric module,
   the first thermoelectric module is on the semiconductor chip, and
   the second thermoelectric module is between the substrate and the semiconductor chip.

4. The semiconductor package of claim 1, wherein the thermoelectric module surrounds a sidewall of the semiconductor chip.

5. The semiconductor package of claim 1, wherein the thermoelectric module includes a first metal film, a second metal film, and a plurality of p-type semiconductors and a plurality of n-type semiconductors alternately arranged in a planar view,
   one of the plurality of p-type semiconductors is connected to the first metal film, a first providing temperature being provided to the first metal film,
   one of the plurality of n-type semiconductors is connected to the second metal film, a second providing temperature being provided to the second metal film, and
   an operating current flows through the first and second metal films in accordance with a difference between the first providing temperature and the second providing temperature to apply the auxiliary power to the semiconductor chip.

6. The semiconductor package of claim 1, further comprising:
   a temperature control circuit configured to measure the temperature provided to the semiconductor chip, and is configured to provide a current to the thermoelectric module,
   the thermoelectric module and the semiconductor chip are connected to each other through a first transistor, and
   the thermoelectric module and the temperature control circuit are connected to each other through a second transistor.

7. The semiconductor package of claim 6, wherein the thermoelectric module includes a first metal film, and a second metal film which is not in contact with the first metal film,
- a first providing temperature is provided to the first metal film,
- a second providing temperature is provided to the second metal film,
- the temperature control circuit is configured to measure a temperature variation between the first providing temperature and the second providing temperature, and
- the voltage measurement circuit is configured to control the first transistor and the second transistor in response to the temperature variation.

8. The semiconductor package of claim 7, wherein, when the temperature variation is higher than a target temperature variation, the voltage measurement circuit is configured to control to turn on the second transistor and input the current to the thermoelectric module.

9. The semiconductor package of claim 7, wherein when the temperature variation is lower than a target temperature variation,
- the voltage measurement circuit is configured to turn on the first transistor, and the thermoelectric module is configured to apply the auxiliary power to the semiconductor chip.

10. A semiconductor package comprising:
- a semiconductor chip on a substrate;
- a thermoelectric module configured to convert heat released from the semiconductor chip into an auxiliary power and configured to apply the auxiliary power to the semiconductor chip;
- a voltage measurement circuit configured to control the thermoelectric module to apply the auxiliary power to the semiconductor chip in response to a change in an external voltage to be input into the semiconductor chip; and
- a temperature control circuit configured to transmit a control signal to the voltage measurement circuit in response to a providing temperature provided to the semiconductor chip, and configured to provide a temperature control current to the thermoelectric module,
- wherein the voltage measurement circuit is configured to control the temperature control current provided to the thermoelectric module by the temperature control circuit, in accordance with the control signal.

11. The semiconductor package of claim 10, wherein the thermoelectric module includes a plurality of p-type semiconductors, a plurality of n-type semiconductors, a first metal film and a second metal film alternately arranged in a planar view,
- a first voltage is applied to the p-type semiconductor on the first metal film among the plurality of p-type semiconductors,
- a second voltage is applied to the n-type semiconductor on the second metal film among the plurality of n-type semiconductors, and
- heat generated from the semiconductor chip according to a difference between the first voltage and the second voltage is absorbed.

12. The semiconductor package of claim 10, wherein the thermoelectric module and the semiconductor chip are connected to each other through a first transistor,
- the thermoelectric module and the temperature control circuit are connected to each other through a second transistor, and
- the voltage measurement circuit is configured to operate the first transistor and the second transistor.

13. The semiconductor package of claim 12, wherein when the external voltage is not applied, the first transistor is turned on, and the thermoelectric module inputs the auxiliary power into the semiconductor chip.

14. The semiconductor package of claim 12, wherein the thermoelectric module includes a first metal film, and a second metal film which is not in contact with the first metal film,
- a first providing temperature is provided to the first metal film,
- a second providing temperature is provided to the second metal film,
- when a difference between the first providing temperature and the second providing temperature is higher than a target temperature variation, the second transistor is turned on and the temperature control current is input into the thermoelectric module.

15. The semiconductor package of claim 14, wherein the temperature control current is input into the thermoelectric module, and the thermoelectric module is configured to absorb heat generated in the semiconductor chip to cool the semiconductor chip.

16. An electronic device comprising:
- a first nonvolatile memory configured to store first data;
- a first thermoelectric module adjacent to the first nonvolatile memory, and configured to absorb heat released from the first nonvolatile memory to adjust a first providing temperature provided to the first nonvolatile memory;
- a first temperature control circuit configured to provide a first temperature control current to the first thermoelectric module in response to the first providing temperature; and
- a power management module configured to receive a control signal from the first temperature control circuit, configured to adjust the temperature control current, and configured to provide a first operating voltage to be input into the first nonvolatile memory,
- wherein the first thermoelectric module is configured to convert the heat released from the first nonvolatile memory into a first preliminary power, and
- the power management module is configured to control the first thermoelectric module to apply a first auxiliary power to the first nonvolatile memory, in response to a change in the first operating voltage.

17. The electronic device of claim 16, wherein when the first operating voltage is not applied to the first nonvolatile memory, the power management module is configured to apply the first auxiliary power to the first nonvolatile memory.

18. The electronic device of claim 16, wherein the power management module is in contact with the first nonvolatile memory and is configured to absorb heat generated in the first nonvolatile memory to cool the first nonvolatile memory.

19. The electronic device of claim 16, further comprising:
- a second nonvolatile memory configured to store second data;
- a second thermoelectric module adjacent to the second nonvolatile memory, absorbs heat released from the second nonvolatile memory, and configured to adjust a second providing temperature to be provided to the second nonvolatile memory; and a second temperature control circuit configured to provide a second temperature control current to the second thermoelectric module in response to the second providing temperature, wherein the power management module is configured to receive an input of a control signal from the first temperature control circuit and adjusts the temperature control current.

20. The electronic device of claim 19, wherein the second thermoelectric module is configured to convert the heat released from the second nonvolatile memory into a second preliminary power, and the power management module is configured to control the second auxiliary power, and a second external voltage applied to the second nonvolatile memory.

* * * * *